United States Patent [19]

Murray et al.

[11] 4,237,530

[45] Dec. 2, 1980

[54] HIGH MAST LIGHT SUPPORT SYSTEM

[75] Inventors: Joseph E. Murray, Walbridge; Aloysius M. Mocek, Jr., Toledo, both of Ohio

[73] Assignee: Rowe Industries Inc., Division of Groman Corporation, Toledo, Ohio

[21] Appl. No.: 859,696

[22] Filed: Dec. 12, 1977

[51] Int. Cl.[3] .................... H05K 7/10

[52] U.S. Cl. .................... 362/418; 362/391; 362/403; 362/431

[58] Field of Search .............. 362/418, 391, 403, 431, 362/405, 419, 427, 428, 285; 248/125, 316 R, 320, 324, 325, 327

[56] References Cited

U.S. PATENT DOCUMENTS

| | | | |
|---|---|---|---|
| 1,777,734 | 10/1930 | Reynolds | 362/431 |
| 2,391,795 | 12/1945 | Oliver | 362/418 |
| 2,456,179 | 12/1948 | Finer | 362/431 |
| 3,218,446 | 11/1965 | Langer | 362/431 |
| 3,752,430 | 8/1973 | Kenyon | 362/431 |
| 3,801,813 | 4/1974 | Kuhn | 362/403 |
| 4,115,845 | 9/1978 | Blahut | 362/403 |

*Primary Examiner*—Benjamin R. Padgett
*Assistant Examiner*—J. L. Barr
*Attorney, Agent, or Firm*—Charles F. Schroeder

[57] ABSTRACT

A high mast lighting system for highways, airports, parking lots and the like of the type in which light bulbs are mounted on a ring shaped platform of a diameter such that it surrounds the mast and can be raised and locked into a lighting position at the top of the mast by operation of cables extending to the base of the mast. The invention is particularly directed to a novel locking and supporting mechanism for support of the lighting ring platform at the top of the mast independent of its lift cables and in which the locking pawls supporting the ring can be disengaged from their supporting position by operating the lift cables from the base of the mast to permit lowering of the ring for maintenance such as a change of bulbs.

19 Claims, 2 Drawing Figures

HIGH MAST LIGHT SUPPORT SYSTEM

This invention relates to high mast lighting systems wherein a light bulb assembly in the form of an annular platform or ring of diameter large enough to encompass the mast and on which spaced bulbs are mounted, can be raised to the top of the mast and supported thereon in locked relation thereon during use and can be lowered to the base of the mast when required such as for bulb changes and maintenance of other components of the ring assembly. More particularly, the invention is directed to the luminaire ring supporting arrangement whereby the ring can be lifted by cables and locked in its lighting position as well as disengaged from its locked supported position and readily lowered to the base of the mast by operating the cables at the base of the mast.

High mast lighting systems for highways, parking lots, airports and the like with the advent of higher intensity lightbulbs are being built to progressively greater heights considerably over 100 feet with the result that the forces of the weather at such heights are a greater problem than before. Manipulation of the cables for lifting and locking of the lighting platform into a lighting position at the top of the mast correspondingly becomes more difficult and important and demands even more positive securement of the platform into its lighting position against the greater forces of the elements to which it will be subjected while at the same time requiring ease of disengagement for maintenance.

Prior art lighting systems of this type have in some instances relied upon the lift cables to hold the lighting platform in its lighting position. Under these circumstances, however, any subsequent elongation or sag in the cables caused a loosening and partial lowering of the platform from the desired lighting position.

With such difficulties in view and in view of the greater likelihood of such assemblies being subjected to unpredictable forces of greater magnitude as they extend to greater heights, the present invention is directed to providing a new more positive support arrangement for high mast lighting platforms without placing the weight of the platform on the cables and which support system will lock the platform in position against forces such as high winds at the height to which the platform is lifted.

Another object of the invention is to provide a locking support system for holding high mast lighting platforms in their lighting position but which can be unlocked by operation of the lift means from the base of the mast to permit them to be lowered such as for maintenance purposes.

A still further object of the invention is to provide a locking support system for the lighting platform of high mast lighting systems which will permit lifting of the lighting platform smoothly and readily to its lighting position for placement in a positively locked position but which will also allow ready disengagement of the locking mechanism for lowering of the platform without sacrificing the positiveness of securement of the platform when held in its supported position.

Still another object of the present invention is to provide a locking support arrangement for lighting platforms of high mast lighting systems wherein the platform can be readily raised and locked in its lighting position and can be disengaged from such locked relation when a known series of steps are followed but which is not readily capable of being lowered without the knowledge of the sequence of steps which must be followed.

BRIEF DESCRIPTION OF THE INVENTION

In the locking support arrangement of the present invention all moving parts for locking and support of the annular ring lighting platform are assembled on the platform itself. Locking support latches or pawls are positioned in spaced relation about the platform such that when the platform is drawn up to a supporting headframe assembly at the top of the mast, the pawls engage and are pushed aside by support members on the headframe as the platform is lifted past the support members. After passing the support members, the pawls are released and repositioned under the influence of biasing springs to orient the pawls for subsequent lowering into its lighting position. The support members are located in positions on the headframe assembly such that when the ring rests thereon with the pawls acting in a sense as legs, the lighting platform will be totally supported thereon in its lighting position without placing a load on the cables.

The headframe or capstan assembly is also provided with overlying reset members for resetting the position of the locking support pawls upon drawing the lighting platform up to the level of the reset members. The reset members reorient the pawls to a position where they are held by their biasing spring members for lowering of the lighting platform past the support members on the headframe. Upon passing the support members on the capstan, reset portions of the pawls are arranged to engage the support members to reset the pawls to their original lift position ready for another lift cycle.

A feature of the invention is the ease of maintenance of the lighting and locking support mechanism since all moving parts can be mounted on the lighting platform which allows them to be lowered to the base of the platform for any necessary repair or replacement.

Another feature of the invention lies in the ease with which the platform can be raised and positively locked in its lighting position, as well as the ease with which it can be disengaged from its locked position, by lifting and resetting the pawls to permit lowering of the platform.

Another and still further feature of the invention lies in the ease with which the lighting platform can be locked into lighting position and disengaged from such position by following a key sequence of steps yet which is not readily accomplished without such knowledge so that it is less subject to damage by pranksters or vandals.

Other objects and structural features which are characteristic of my invention are set forth with particularity in the appended claims. My invention however, both in organization and manner of construction, together with further objects and features thereof may be best understood by reference to the following description taken in connection with the accompanying drawings in which:

Figure 6:
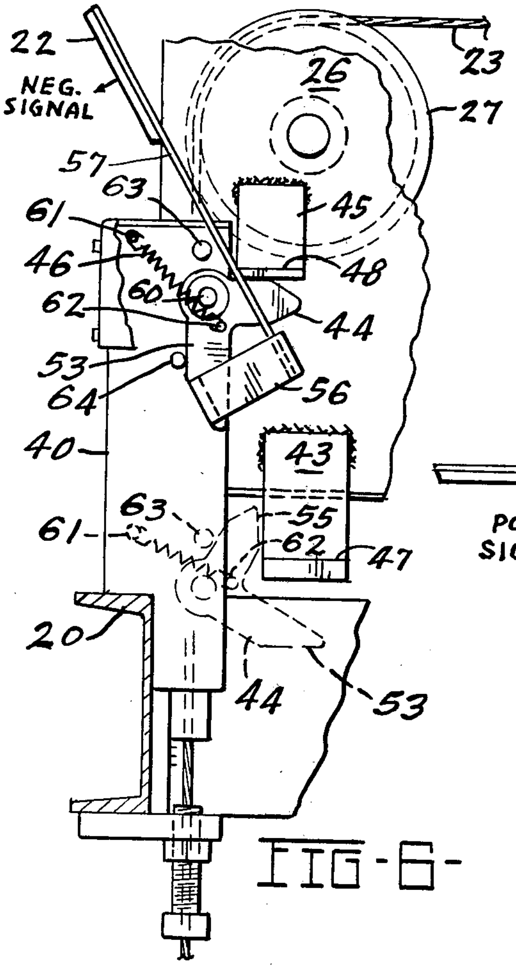
Figure 7:
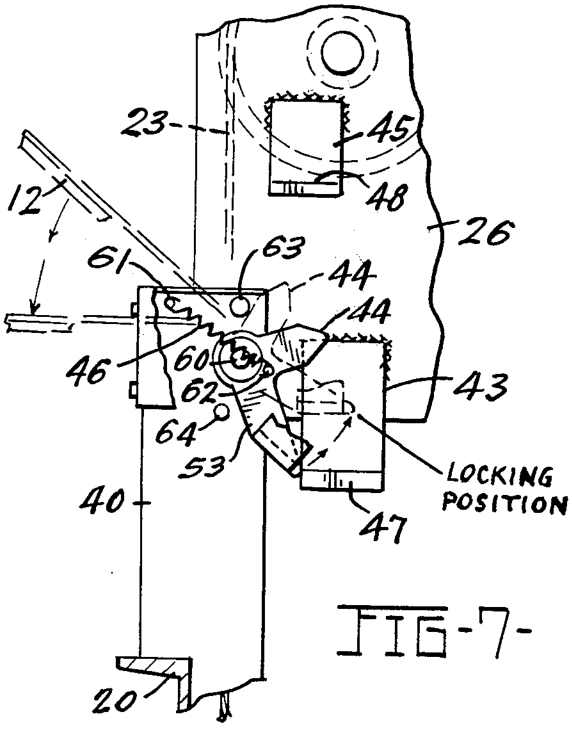
Figure 8:
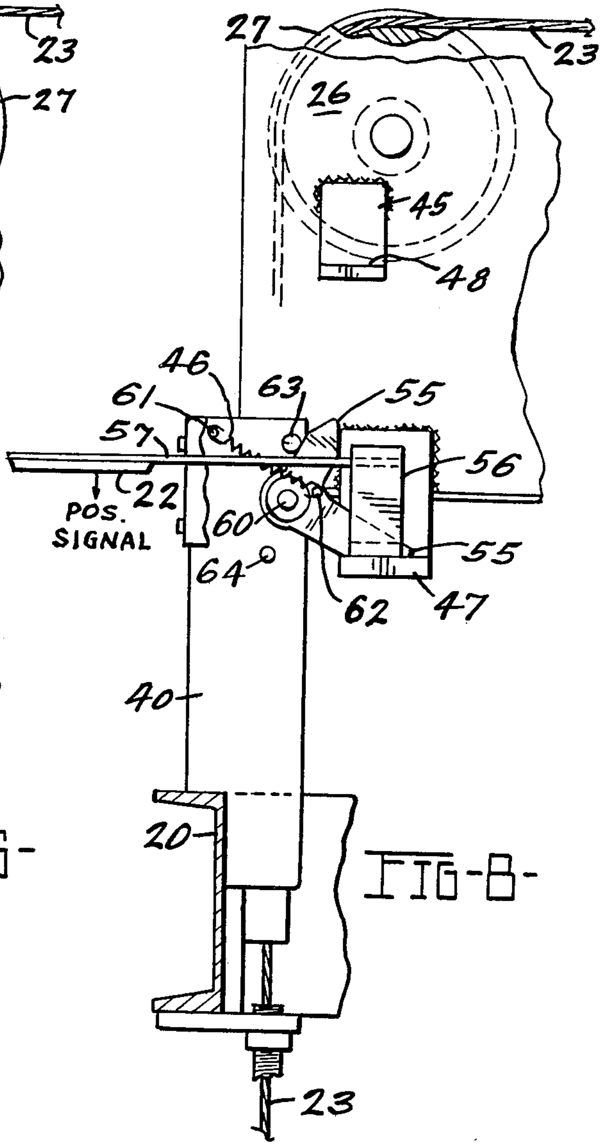

FIGS. 6, 7, and 8 are elevational views of the ring support mechanism of the invention illustrating the lighting ring of FIG. 1 in various positions in relation to the support members on the headframe assembly and showing in detail various positions of the locking support pawls as the lighting ring is lifted to its support position and then subsequently lifted to a still higher reset position to permit lowering of the lighting ring past the support members and engagement by the pawls to be reset for another subsequent cycle of lift of the lighting ring.

Figure 1:
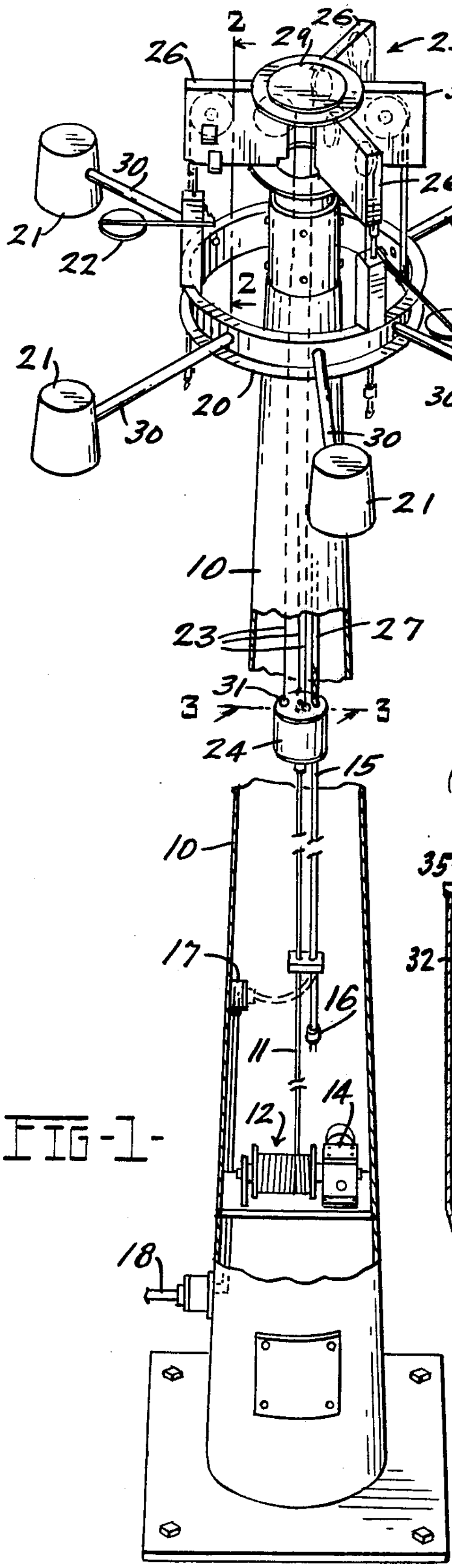
FIG. 1 is a perspective partially broken away view of a high mast lighting assembly in which a hollow mast has an associated lighting ring which can be raised and lowered by a cable winch mounted in the hollow section at the base of the mast.

Referring to the drawings in greater detail, FIG. 1 illustrates in an overall view of a high lighting mast assembly embodying the present invention in which the mast 10 has an annular lighting platform or ring 20 with luminaires 21 arranged to be lifted to the top of the mast. The ring is lifted by three lift cables 23 connected through a transition coupling 24 within the mast to a single lift cable 11 which is drawn by a winch 12 located within the base of the mast. Mechanical power to drive the winch is supplied from a motor (not shown) conventionally available in the form of a portable unit which can be mechanically connected to operate the winch through a gear reducer 14.

Energy for the luminaires 21 is supplied by way of a power cable 15 which extends down through the hollow of the mast 10 to a male connector plug 16 at its end which can be plugged into a female socket 17 connected to an external power source 18. The path of the power supply cable 15 generally parallels that of the lift cables 23 and 11 and is moved generally therewith.

Figure 4:
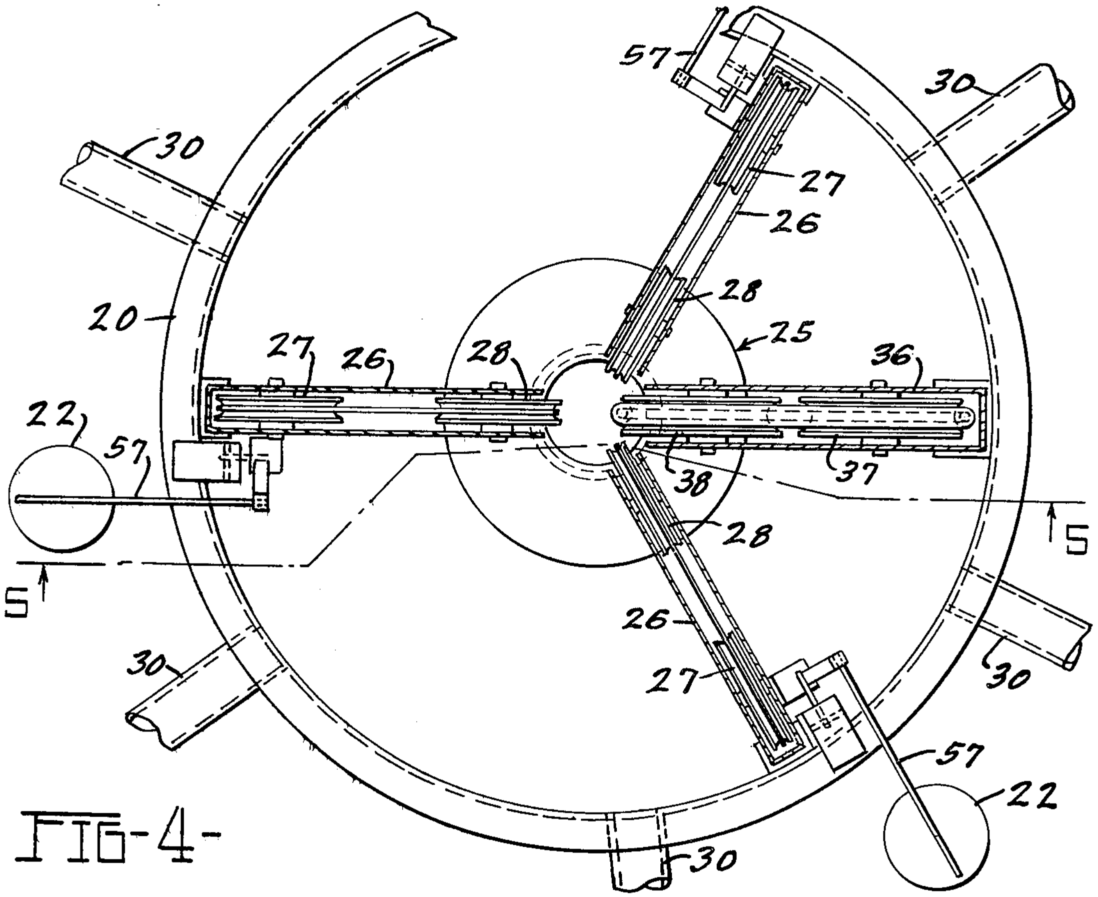
FIG. 4 is a top plan view of the headframe assembly at the top of the mast of FIG. 1 showing the annular lighting ring and showing in part the luminaire support arms extending therefrom.
Figure 5:
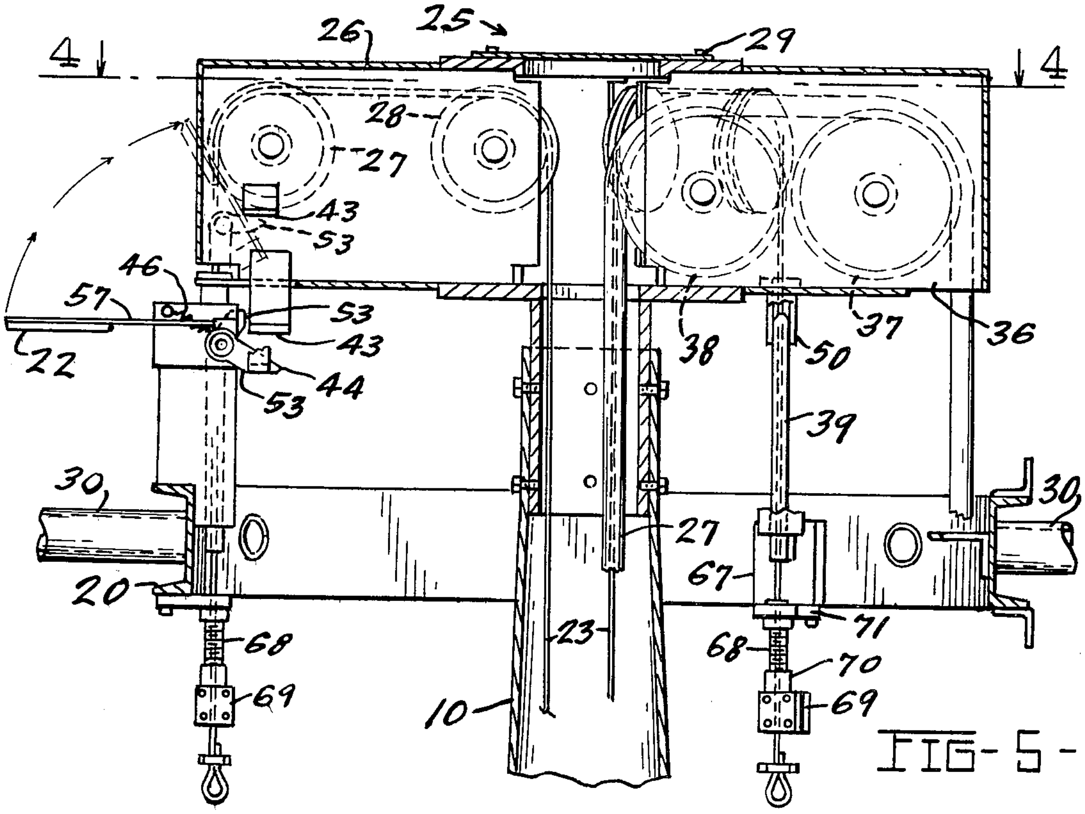
FIG. 5 is a cross-sectional side elevation view of the headframe or capstan assembly and lighting ring as taken on line 5—5 of FIG. 4.

FIGS. 4 and 5 illustrate in greater detail the headframe or lift cable capstan assembly 25 to which the ring 20 with its outwardly extending luminaires 21 on support arms 30 can be lifted by way of the cables 23 and 11 to the upper regions of the mast. The capstan assembly 25 is made up of three lift cable wings 26 and a power cable wing 36. Each lift cable wing has an outer pulley 27 and inner pulley 28 rotationally mounted therein and over which one of the lift cables 23 passes for terminating connection to the ring 20. The power cable wing 36 has an outer pulley 37 and an inner pulley 38 rotationally mounted therein over which the power cable 15 is moved in unison with the lift cables 23 during lifting and lowering of the ring 20. The entire capstan assembly 25 is topped with a cap plate 29 to cover the hollow central region of the mast at its very top.

Figure 2:
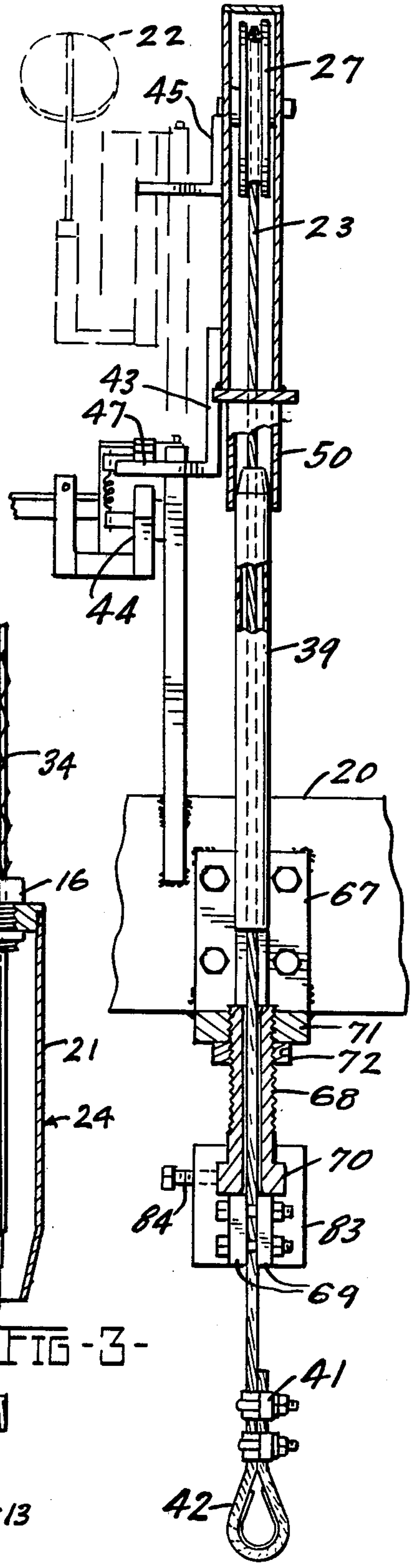
FIG. 2 is a view of a portion of the lighting ring and an associated portion of the head assembly illustrating the manner in which lift cables secured to the lighting ring are provided with aligning members to assure proper alignment of the locking support pawls with the support members on the headframe assembly when the lighting ring is drawn up to its lighting position.

FIG. 2 illustrates the arrangement by which the ring 20 is guided as it is lifted to its lighting position in alignment with the capstan assembly so that the locking pawls 44 of the invention can make engagement with the support members 43 for support of the luminaire ring. Upwardly extending hollow guide rods 39 are supported on the ring 20 such as by welding them to mounting plates 67 which in turn are welded or bolted to the outer periphery of the ring. Each of the three cables 23 extends axially through one of the guide rods 39 into a region below the ring and through a hollow level adjusting stud 68 where each of the cables is clamped by a stabilizing clamp plate 69 on which the ring rests to hold it in supported relation on the cables. The hollow leveling studs 68 threadably secured to the ring 20 each has a shoulder 70 which bears on its respective stabilizing clamp plate 69 to support the ring. The terminal end of each cables 23 is wrapped around an eyelet 42 and secured by a cable terminal clamp 41 to provide an eyelet to facilitate handling the ring when it is lowered to the base of the mast.

Upon lifting of the ring to its uppermost region, the guide rods 39 each makes engagement with a mating guide tube 50 located generally at the outer end of the capstan cable wing 26 to properly align the ring for its support on the capstan assembly as described hereinafter.

As illustrated in FIG. 5, each of the three capstan wings 26 has an associated underlying downwardly extending guide tube 50 which is aligned to receive one of the guide rods 39 on the ring to guide the ring to its lighting position. Thus upon lifting of the luminaire ring to the capstan, the guide tubes 39 are pulled into inserted guided relation with their respective guide tubes 50 to establish a rather precisely aligned circumferential position relationship with the mast. This assures that the locking support pawls 44 on the ring will make proper aligned engagement with their respective support members 43 on the capstan assembly.

FIGS. 6 and 7 illustrate more clearly the manner in which the locking support pawls 44 are aligned to make mated engagement with a right-angularly projecting support pad 47 of a support member 43 and a right-angularly projecting reset pad 48 of a reset member 45. The pawls 44 are each mounted on one of three separate upright pedestal arms 40 mounted on the ring 20 such as by being welded thereto. Each of the pawls is mounted on a pivot axis 60 and is generally L-shaped with one arm being a support portion 53 and the other arm being a reset portion 55.

Upon lifting of the ring to a region just below the capstan where the pawls just about make contact with the support members 43, FIG. 6 illustrates in dotted lines the manner in which the reset arm portion 55 of a pawl 44 will clear the support pad 47. It can be seen, however, that upon moving the ring upward a slight amount more past the illustrated dotted line region, the support arm portion 53 will engage the underside of the support pad 47 and rotate the pawl on its pivot 60 as shown in FIG. 7. The pawl is rotated against the force of tension of a spring 46 extending between a spring anchor pin 61 on the upright arm 40 and a pawl spring pin 62 on the pawl 44 in an aligned position offset from the pivot axis 60 of the pawl. The pawl 44, upon being lifted past the support member 43 is pushed laterally sideways by the support pad 47. After passing the pad 47, the pawl is released and drawn in a counter-clockwise direction by the spring to a position where its support arm 53 lies over the pad 47. The limit of movement of the pawl in this direction is determined by a limit pin 63 mounted above the pawl on the arm 40 as shown in dotted lines on FIG. 7. The ring can then be lowered for support in its lighting position on the three capstan wings 26 in which the weight of the ring assembly is removed from the lift cables 23 and is placed by the pawls 44 onto the support pads 47 as illustrated in FIG. 8.

A position indicating flag provided in association with each of the pawls 44 is arranged to extend outwardly to a position visible from the base of the mast when the pawls are in their ring supporting position as shown in FIG. 8. The pawl limit stop pin 63 fixes the limit of the movement of the pawls as well as the flag on its arm 57 to assure that the flag is in the horizontal position visible from below when the ring is in its properly mounted position in supported relation on the support members 43.

FIGS. 6, 7 and 8 illustrate the different positions of the locking support pawls of the luminaire assembly as exemplified by one of the pawls shown during lifting, support and lowering of the luminaire ring 20 in relation to its lighting position on the capstan assembly 25. The pawl 44 is rotatable on its pivot pin 60 between its locking support position against the limit support pin 63 and its reset position against a reset limit pin 64 as shown in dotted lines in FIG. 6. The spring 46 extending between the anchor pin 61 and the pawl spring pin 62 actuates and by toggle action holds the pawls in either of these two extreme positions under tension when the pawl is moved to either position. This is accomplished by placing the pawl spring pin 62 in a location such that upon movement to either of these positions the spring is oriented on either one of the other side of the pivot pin 60. In this regard, the spring draws the pawl arm 55 against the pawl limit stop 63 when the pawl is in position for support of the ring. When the pawl is in its reset position, the spring draws the pawl arm 53 against the reset limit pin 64. In this position the pawl is oriented for lowering of the ring 20 ready for reset of the pawl to its start position by engagement of the reset arm 44 with the support pad 47 as the ring is lowered from its position shown in FIG. 6.

The biasing action of the spring 46 is assisted by the weight of the flag 22 in combination with its support arm 57 and its mount 56 on the pawl 44. The flag mount 56 extends laterally from the end of the pawl support arm 53 to allow it to clear the support pad 47 during lifting and lowering of the ring to and from its lighting position. The weight of this flag mount assembly is distributed such that it assists the biasing action of the spring 46 by being majorly located on one side of the pivot pin 60 such that it will place the pawl in its reset position as shown in FIG. 6 to permit the ring to be lowered in the event that the spring 46 should become broken.

In brief review of the step-by-step cycle of operation of the locking support mechanism for the luminaire ring 20 during lifting, support, and lowering of the ring, FIG. 6 shows in dotted lines and FIG. 7 shows in solid lines the orientation of the pawl 44 as it is being lifted past the support pad 47 of the support member 43. The support arm portion 53 of the pawl 44 is pushed laterally to the left in the illustrations as it moves past the support pad 47, but is biased to the right by reason of the tension of the spring 46 pulling at the pawl pin 62. When the ring 20 is lifted to a position where the support arm 53 is free of engagement with the support pad 47, the spring 46 pulls the pawl 44 into engagement with its support limit stop pin 63 in which position the pawl support arm 53 is oriented for lowering of the luminaire ring into its lighting position locked in engagement with the support pad 47 as shown in FIG. 8. The ring is thus supported on the three locking support pawls 44 in association with their respective support pads 47 without placing a load on the lift cables 23 which were used to draw them into the lighting position. In this ring position, the position indicating flags 22 are extended into their extreme outward position where they are each visible from the base of the mast 10 to indicate that their respective pawls are each in their proper position to lock the ring into its supported position.

When the luminaire ring 20 is to be lowered, it is first drawn upward until the reset arms 55 make engagement with the reset pads 48 of the reset members 45 as shown in FIG. 6. In this position the pawl reset arm 55 makes contact with the reset pad 48 and is pushed clockwise to where the support arm 53 contacts the reset limit pin 64. The spring 46 is thereby moved to a position on the opposite side of the pivot pin where it in combination with the weight of the flag holds the pawl in a lowering position to permit lowering of the ring to where the reset arms 55 will engage the support pads 47 to move them into their start position as shown in dotted lines in FIG. 6.

A leveling mechanism is provided to assure that the lighting ring is level so that the pawl support members are all in proper vertical alignment for engagement with the pawl support pads 47 when the ring is drawn up to the capstan assembly. The ring leveling mechanism as shown in FIG. 2 includes a leveling stud 68 associated with each lift cable 23 which makes threadable engagement with a projecting flange 71 of the guide tube mounting plate 67 associated with the respective lift cable. The leveling stud is a hollow stud through which the cable 23 passes from its path through the guide tube 39 to its terminating end at the cable terminal eye 42. Oppositely-disposed stabilizing plates 69 which clamp the cable above its terminal end provide a resting platform for the ring with the adjusting stud 68 providing, in a sense, a leg which stands on the stabilizing clamp plate 69. Thus when a leveling adjustment is to be made, the leveling stud 68 merely need be turned in or out in its threadable engagement with the mounting plate 67 without need for unclamping the cables at the clamping plates 69. After the stud 68 is properly located, a bracket 83 extending from the top of flange 70 of the stud 68 to the underside of plates 69 holds the stud and clamping plates together in their abutted relation. A set screw 84 on the bracket 83 and extending into an aperture in the stud 68 fixes the stud against rotation. A lock nut 72 on the stud 68 bears against the underside of the flange 71 also to lock the stud in its adjusted position.

Figure 3:
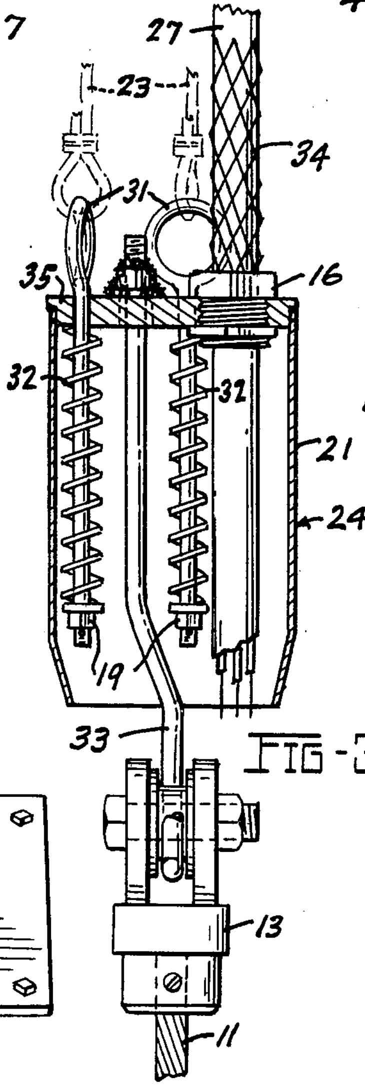
FIG. 3 is a cross-sectional view taken on line 3—3 of the cable transition coupling shown in FIG. 1 by which the single winch cable is coupled to a number of lift cables connected to the lighting ring.

FIG. 3 shows in detail the cable transition coupling assembly 24 wherein the three cables 23 are secured to eye bolts 31 which extend through a transition plate 35 and which are biased to a position with the eye of the bolt drawn to the top of the transition plate 35 by helical springs 32 located on the opposite side of the transition plate and which are held about the shanks of the eye bolts by a suitable means such as retaining nuts 19 threadably engaging the end of the bolts. The single cable 11 is connected to the assembly by a "U" bolt 33 which extends upwardly through the transition plate 35 and is secured thereto by its ends being welded to the top of the transition plate. The electrical cable 27 passes through an aperture in the transition plate coupling to an underlying male connector plug 16, shown in FIG. 1. To provide an adjustment in the length of the cable on both sides of the transition plate 35, a chinese finger-type grip 34, commercially available on the market as a Kellum grip, is provided in surrounding relation with the cable and threadably secured to the transition plate 35 at the aperture through which the cable 27 passes. This allows sliding and rotational adjustment of the electrical cable within the aperture but establishment of a gripping relation therewith when an upward force is applied to the electrical cable 27. A feature of this type of grip arrangement is that the electrical cable can also rotate and relieve itself of torque stresses and at the same time the cable will not back out of the plate aperture through which it extends because of the gripping action of the Kellum grip.

A shroud 21 surrounds the spring assembly below the transition plate 35 to reduce the possibility of the springs of the assembly becoming snagged with the cable during operation of the lift system. The shroud 21 is tapered inward at its lower end while the upper edge of the transition plate 35 is beveled to further reduce the possibility of snagging with the cables during movement of the transition coupling up and down within the hollow mast 10.

Although three locking support pawls are shown in the drawings and described in the specification, it will be recognized by those skilled in the art that only one or two or additional such pawls might also be utilized within the concepts of the present invention. Additionally, although it is preferable that the moving parts be located on the luminaire ring, in some instances it might be desired to place some or all on the headframe assembly. Still further, the pawl configuration might be modified within the concepts of the present invention by deletion of a reset arm and providing other means of effecting a reset of the support arm of the pawl. In this regard, reset pins might be provided both on the headframe assembly and on the ring to facilitate movement of the locking support arm to its supporting and lowering positions.

In view of the foregoing, it will be understood that many variations of the arrangement of our invention can be provided within the broad scope of principles embodied therein. Thus, while a particular preferred embodiment of our invention has been shown and described, it is intended by the appended claims to cover all such modifications which fall within the true spirit and scope of the invention.

We claim:

1. A lighting assembly comprising in combination a high mast and an annular light carrying unit in which the light carrying unit can be raised and lowered by lift means operable from the lower region of the mast, locking means for locking said light unit in an upper lighting position on said mast comprising a plurality of like single pivotal locking members on said light unit and matching support members having no moving parts aligned on said mast for engagement with said locking members, said locking members each being pivotable to a support position in which it will engage its matching support member when said light unit is raised to its lighting position, each said locking member having associated biasing means imparting a normal support position orientation to said locking member, each said locking member being located for movement against the force of its associated biasing means upon engagement with its matching support member when said light unit is lifted to its lighting position, each said locking member then being biased to its normal support position again under the influence of its respective biasing means when said light unit is lifted higher than its lighting position to provide support for said light unit upon unit and said support member being lowered from said higher position into supported engagement with its matching support member.

2. A lighting assembly as set out in claim 1 wherein at least three of said support members are positioned in stationarily spaced relation about said mast and a corresponding number of mating locking members are provided in aligned relation therewith on said light unit.

3. A lighting assembly as set out in claim 2 wherein the lift means comprises lift cables fastened to said light unit.

4. A lighting assembly as set out in claim 3 wherein guide means is provided comprising a projecting guide member and a mating receiving guide member, one of said guide members being on said light unit and the other being associated with said mast for guiding said light unit into aligned relation for engagement between said locking members and said support members as said light unit is drawn to its lighting position.

5. A lighting assembly as set out in claim 3 wherein said locking member has a reset portion and an associated reset member stationarily disposed in association with its mast over said support member such that upon lifting said light unit said reset portion of the locking member will make engagement with said reset member and reorient said locking member for lowering of said ring past said support member.

6. A lighting assembly as set out in claim 5 wherein each single said locking member comprises a support arm and a reset arm engagable with said reset member for reorientation of said locking member for lowering of said unit whereby upon being reoriented said reset arm being engagable with said support member to reset said locking member to a start position for lifting the light unit to its lighting position.

7. A lighting assembly as set out in claim 5 wherein a visible indicator is provided operable in association with at least one of said locking members which provides an indication visible at the base of the mast when said locking member is in its locked support position on said support member.

8. A lighting assembly as set out in claim 7 wherein the visible indicator extends from and is secured to the locking member such that its weight will bias said locking member to a lowering position in the event that said biasing means becomes ineffective.

9. In a lighting assembly comprising a hollow supporting mast and a light carrying unit on said mast which light carrying unit includes a frame encompassing the hollow mast, said light carrying unit being supported by lift cables secured to said frame in spaced relation around the mast and passing over pulleys at the upper portion of the mast and down through the mast to the lower portion thereof, and cable moving means operable from the bottom of the mast by which the lift cables can be operated to raise and lower said light unit between a lighting position at the upper region of the mast and a lower servicing position at the lower region of the mast the improvement comprising a plurality of locking support means for supporting and locking said light unit in its lighting position on said mast, said locking support means comprising a plurality of single pivotal locking members spaced about said light unit and mating stationary support members having no moving parts on said mast engageable by said pivotal locking members, each said locking member being pivotally moveable by its mating support member to clear said support member upon lifting of said light unit to its light position and being there pivotally moveable to a support position over said support member for support of said light unit thereon and manually operable release means for reorienting said pivotal locking members to permit lowering of said light unit past said support members.

10. A light assembly as set out in claim 9 wherein the manually operable release means comprises reset members on said mast above said support member which reset member are engageable by said pivotal locking members for reorientation of said locking members to a lowering position upon lifting of said light unit from its lighting position.

11. A lighting assembly as set out in claim 10 wherein at least three of said stationary support members are positioned in spaced relation about said mast and a corresponding number of mating pivotal locking members are provided in aligned relationship therewith on said light carrying unit.

12. A lighting assembly as set out in claim 11 wherein each of said pivotal locking members is mounted on a separate one of a number of spaced mounting members extending upwardly from said light carrying unit.

13. A lighting assembly as set out in claim 12 wherein guide members are provided comprising a set of guide rods and a set of mating tubular receiving members, one set of said guide members being on said light unit and the other set being mounted in spaced relation about said mast for guiding said light unit into aligned relation for engagement between said locking members and said support members as said lighting unit is drawn to its lighting position.

14. A lighting assembly as set out in claim 13 wherein said guide rods are mounted on and extend upwardly from said light unit and said mating receiving members are mounted in spaced relation about said mast.

15. A lighting assembly as set out in claim 11 wherein said locking members each has a reset portion, and each has a corresponding reset member stationarily disposed in association with said mast over a respective one of said mated support members such that upon lifting of said light unit the reset portions of said locking members will make engagement with said reset members and reorient all of said locking members for lowering of said ring past said support members.

16. A lighting assembly as set out in claim 15 wherein said pivotal locking members each comprise a support arm and a reset arm engageable with the respective reset member for the locking member such that upon lifting said light unit said reset portion of the locking member will make engagement with the reset member and reorient said locking member for lowering of said ring past said support members.

17. A lighting assembly as set out in claim 16 wherein visible indicators are provided each operable in association with an individual one of said locking members to provide an indication visible at the base of the mast when its respective locking member is in locked support position on its support member.

18. A lighting unit as set out in claim 17 wherein the visible indicators each extends from and is secured to its respective locking member such that the weight of the indicator provides biasing forces for locking its respective locking member.

19. A lighting unit as set out in claim 15 wherein the light ring has leveling means each associated with one of said lift cables whereby the level of said light unit can be adjusted in relation to the support members on said mast.

* * * * *